(12) United States Patent
Antolik et al.

(10) Patent No.: US 8,895,452 B2
(45) Date of Patent: Nov. 25, 2014

(54) SUBSTRATE SUPPORT PROVIDING GAP HEIGHT AND PLANARIZATION ADJUSTMENT IN PLASMA PROCESSING CHAMBER

(75) Inventors: Jerrel Kent Antolik, Livermore, CA (US); Yen-kun Victor Wang, Union City, CA (US); John Holland, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 378 days.

(21) Appl. No.: 13/485,166

(22) Filed: May 31, 2012

(65) Prior Publication Data
US 2013/0323860 A1 Dec. 5, 2013

(51) Int. Cl.
*H01L 21/302* (2006.01)

(52) U.S. Cl.
USPC ............. 438/715; 438/14; 118/728; 216/58; 216/67

(58) Field of Classification Search
None
See application file for complete search history.

(56) References Cited

U.S. PATENT DOCUMENTS

| | | | |
|---|---|---|---|
| 4,908,095 A | 3/1990 | Kagatsume et al. | |
| 5,210,466 A | 5/1993 | Collins et al. | |
| 5,716,534 A | 2/1998 | Tsuchiya et al. | |
| 5,820,723 A | 10/1998 | Benjamin et al. | |
| 5,900,103 A | 5/1999 | Tomoyasu et al. | |
| 5,904,487 A | 5/1999 | Conboy et al. | |
| 5,948,704 A | 9/1999 | Benjamin et al. | |
| 6,130,427 A | 10/2000 | Park et al. | |
| 6,229,264 B1 | 5/2001 | Ni et al. | |
| 6,364,958 B1 | 4/2002 | Lai et al. | |
| 6,377,437 B1 * | 4/2002 | Sexton et al. | 361/234 |
| 6,576,860 B2 | 6/2003 | Koshimizu et al. | |
| 6,590,703 B2 | 7/2003 | Park et al. | |
| 6,810,029 B2 | 10/2004 | Ozluturk | |
| 6,863,784 B2 | 3/2005 | Hao et al. | |
| 6,974,523 B2 | 12/2005 | Benzing et al. | |
| 7,419,551 B2 | 9/2008 | Chandrachood et al. | |
| 7,431,797 B2 | 10/2008 | Chandrachood et al. | |
| 7,520,999 B2 | 4/2009 | Chandrahood et al. | |
| 7,713,432 B2 | 5/2010 | Johnson et al. | |
| 7,732,728 B2 | 6/2010 | Dhindsa et al. | |
| 7,829,815 B2 | 11/2010 | Chen et al. | |
| 8,080,760 B2 | 12/2011 | Dhindsa et al. | |
| 2004/0050327 A1 | 3/2004 | Johnson et al. | |
| 2009/0049981 A1 | 2/2009 | Hayashi et al. | |
| 2009/0120584 A1 | 5/2009 | Lubomirsky et al. | |
| 2009/0199766 A1 | 8/2009 | Tappan | |
| 2009/0200268 A1 | 8/2009 | Tappan et al. | |

* cited by examiner

*Primary Examiner* — Kyoung Lee
(74) *Attorney, Agent, or Firm* — Buchanan Ingersoll & Rooney PC

(57) ABSTRACT

A semiconductor substrate support for use in a plasma processing apparatus comprises a chuck body having a plenum and three radially extending bores extending between the plenum and an outer periphery of the chuck body, wherein the chuck body is sized to support a semiconductor substrate having a diameter of at least 450 mm. The semiconductor substrate support further comprises three tubular support arms which include a first section extending radially outward from the outer periphery of the chuck body, and a second section extending vertically from the first section. The tubular support arms provide a passage therethrough which communicates with a respective bore in the chuck body. The second section of each tubular support arm is configured to engage with a respective actuation mechanism outside the chamber operable to effect vertical translation and planarization of the chuck body in the interior of a plasma processing chamber.

22 Claims, 9 Drawing Sheets

US 8,895,452 B2

SUBSTRATE SUPPORT PROVIDING GAP HEIGHT AND PLANARIZATION ADJUSTMENT IN PLASMA PROCESSING CHAMBER

FIELD OF THE INVENTION

The invention relates to plasma processing apparatuses wherein a semiconductor substrate support is moveable in the interior of a vacuum chamber such that gap height and planarization of the substrate are adjustable.

BACKGROUND

Integrated circuits are typically formed from a substrate over which are formed patterned microelectronics layers. In the processing of the substrate, plasma is often employed to deposit films on the substrate or to etch intended portions of the films. Shrinking feature sizes and implementation of new materials in next generation microelectronics layers have put new demands on plasma processing equipment. The smaller features, larger substrate size and new processing techniques create additional demands on control of the plasma parameters, such as plasma density and etch uniformity across the substrate, to achieve desired yields.

In capacitively coupled RF plasma reactors, the electrode opposite to the substrate electrode is generally called the upper electrode. The upper electrode could be grounded, or have one or more radio frequency (RF) power sources attached to it. The substrate electrode is generally called the lower electrode. A mechanical arrangement for a lower electrode in a capacitively coupled plasma processing chamber may involve cantilevering the assembly that includes the lower electrode from a side of the chamber. This cantilevered lower electrode can be a fixed distance from the upper electrode or can be designed for a variable distance from the upper electrode. In either case, planarization of the lower electrode may be affected by sag and RF interference can occur when service conduits to the chuck are located in the interior of the cantilever support arm.

A cantilevered lower electrode assembly to increase planarity control between the upper and lower electrodes is disclosed in commonly-owned U.S. Patent Publication No. 2009/0199766, the disclosure of which is hereby incorporated by reference. While the '766 publication discloses an improved sidewall supported substrate support, due to the need to address smaller substrate features, larger substrate sizes, and new processing techniques, there is a need for improved gap height and planarity control between the upper and lower electrodes to increase etch uniformity across the substrate.

SUMMARY

Disclosed herein is a semiconductor substrate support for use in a plasma processing apparatus. The semiconductor substrate support comprises a chuck body having a plenum and three radially extending bores extending between the plenum and an outer periphery of the chuck body, wherein the chuck body is sized to support a semiconductor substrate having a diameter of at least 450 mm. The semiconductor substrate support further comprises tubular support arms which include a first section extending radially outward from the outer periphery of the chuck body, and a second section extending vertically from the first section wherein each of the tubular support arms defines a passage in communication with one of the radially extending bores. The second section of each tubular support arm is configured to engage with a respective actuation mechanism operable to effect vertical translation and planarization of the chuck body.

The semiconductor substrate support is located in the interior of a vacuum chamber of a capacitively-coupled plasma processing apparatus. The capacitively-coupled plasma processing apparatus further includes an upper showerhead electrode assembly supported by a top wall of the vacuum chamber, and a lower electrode assembly which is incorporated in the semiconductor substrate support. The lower electrode assembly comprises a lower electrode and an electrostatic chuck having a support surface on which a single semiconductor substrate is supported. The second sections of the tubular support arms are located in three openings in the outer wall of the vacuum chamber wherein they are coupled to the three actuation mechanisms. The three actuation mechanisms are located on an outer wall of the vacuum chamber and are independently operable to move the tubular support arms in upward and downward directions. The capacitively-coupled plasma processing apparatus further comprises at least one vacuum port connected to at least one vacuum pump, and a gas source to supply process gas to the vacuum chamber.

BRIEF DESCRIPTION OF THE DRAWING FIGURES

Figure 1:
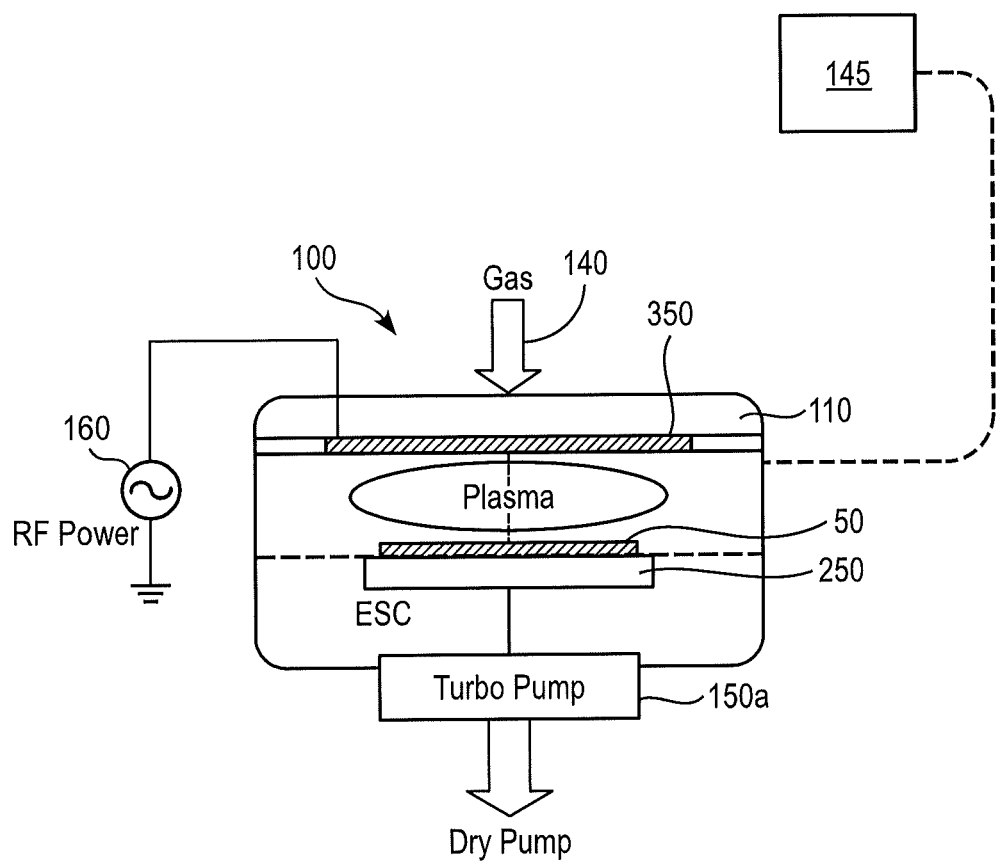
FIG. 1 illustrates a cross-sectional schematic of an embodiment of a capacitively-coupled plasma processing apparatus.
Figure 4A:
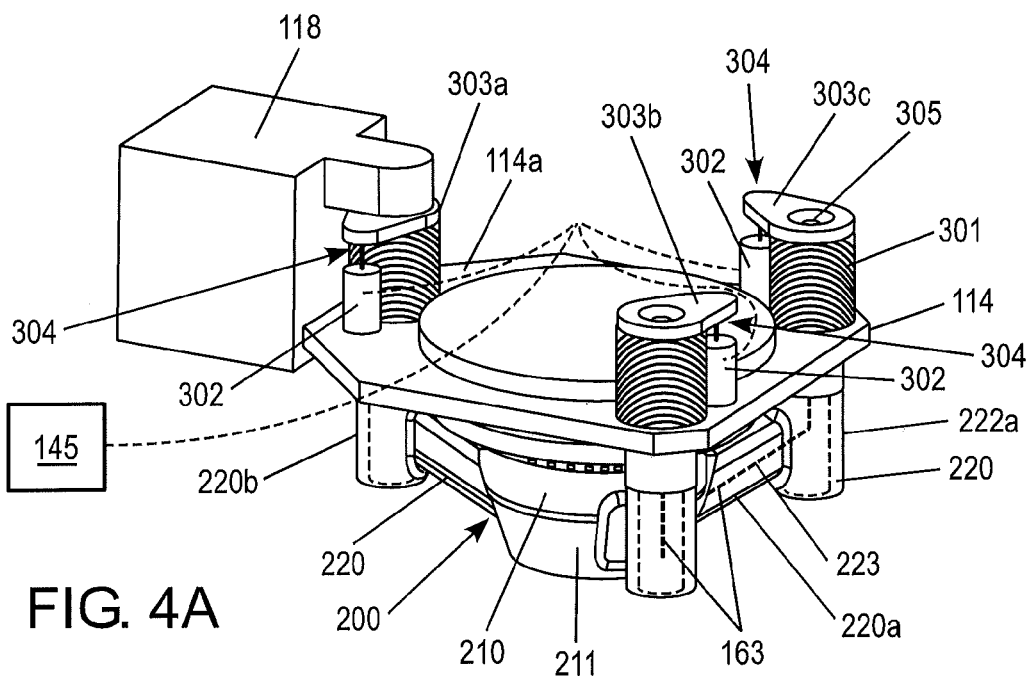
Figure 4B:
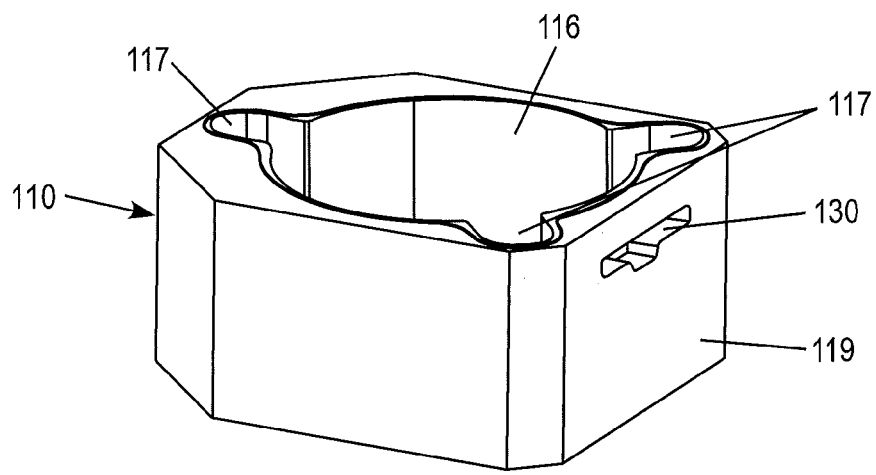
Figure 4C:
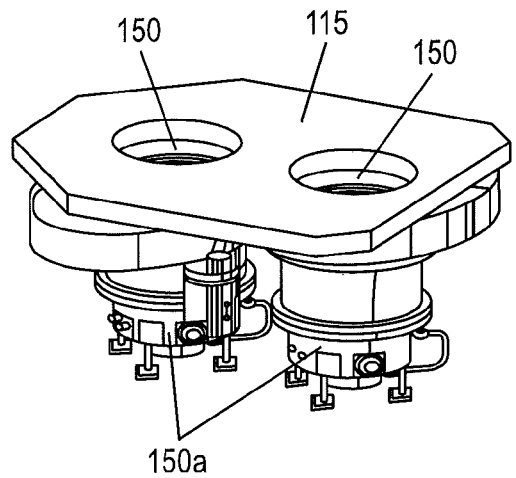

FIG. 4A-C illustrate separable components of the capacitively-coupled plasma processing apparatus shown in FIG. 1.

Figure 5:
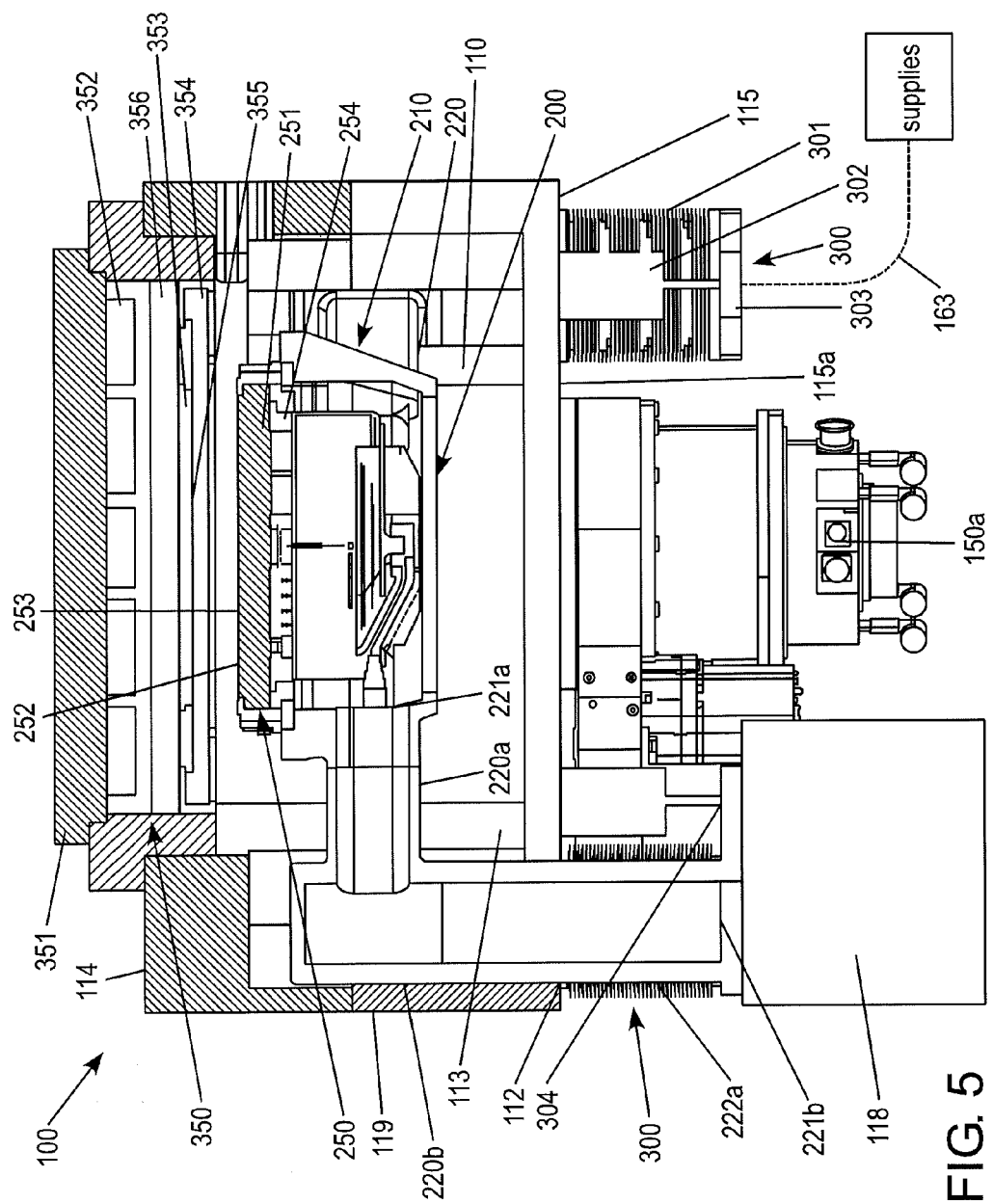

FIG. 5 illustrates a cross section of an alternate embodiment of a capacitively-coupled plasma processing apparatus wherein the support arms extend through a bottom wall.

Figure 6A:
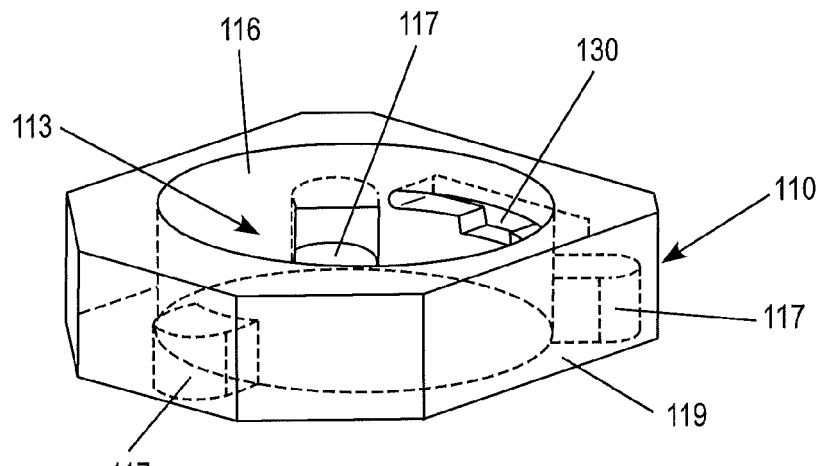

FIG. 6A,B illustrate components of the vacuum chamber and semiconductor substrate support of the alternate embodiment of the capacitively-coupled plasma processing apparatus shown in FIG. 5.

Figure 7:
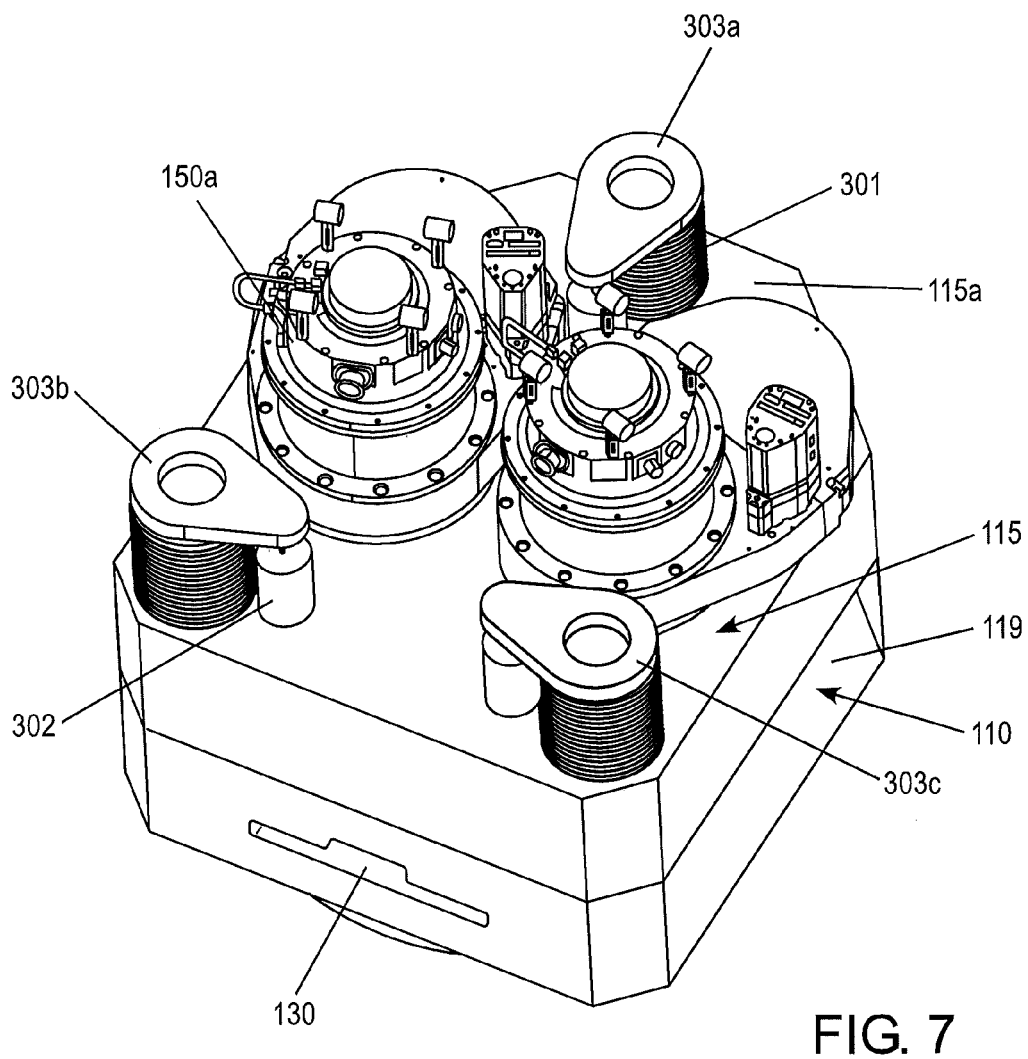

FIG. 7 illustrates a bottom view of the alternate embodiment of the capacitively-couple plasma processing apparatus shown in FIG. 5.

Figure 8:
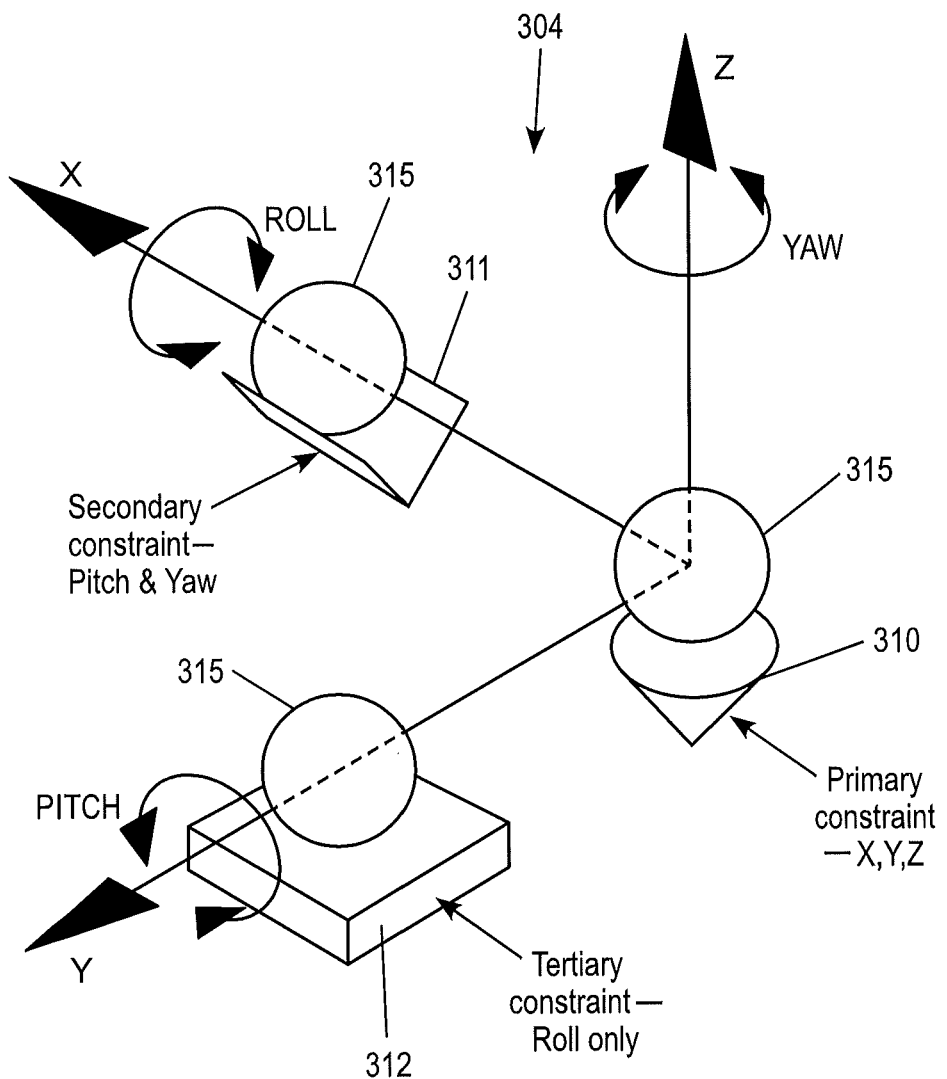

FIG. 8 illustrates a schematic of a preferable kinematic mount configuration.

Figure 9:
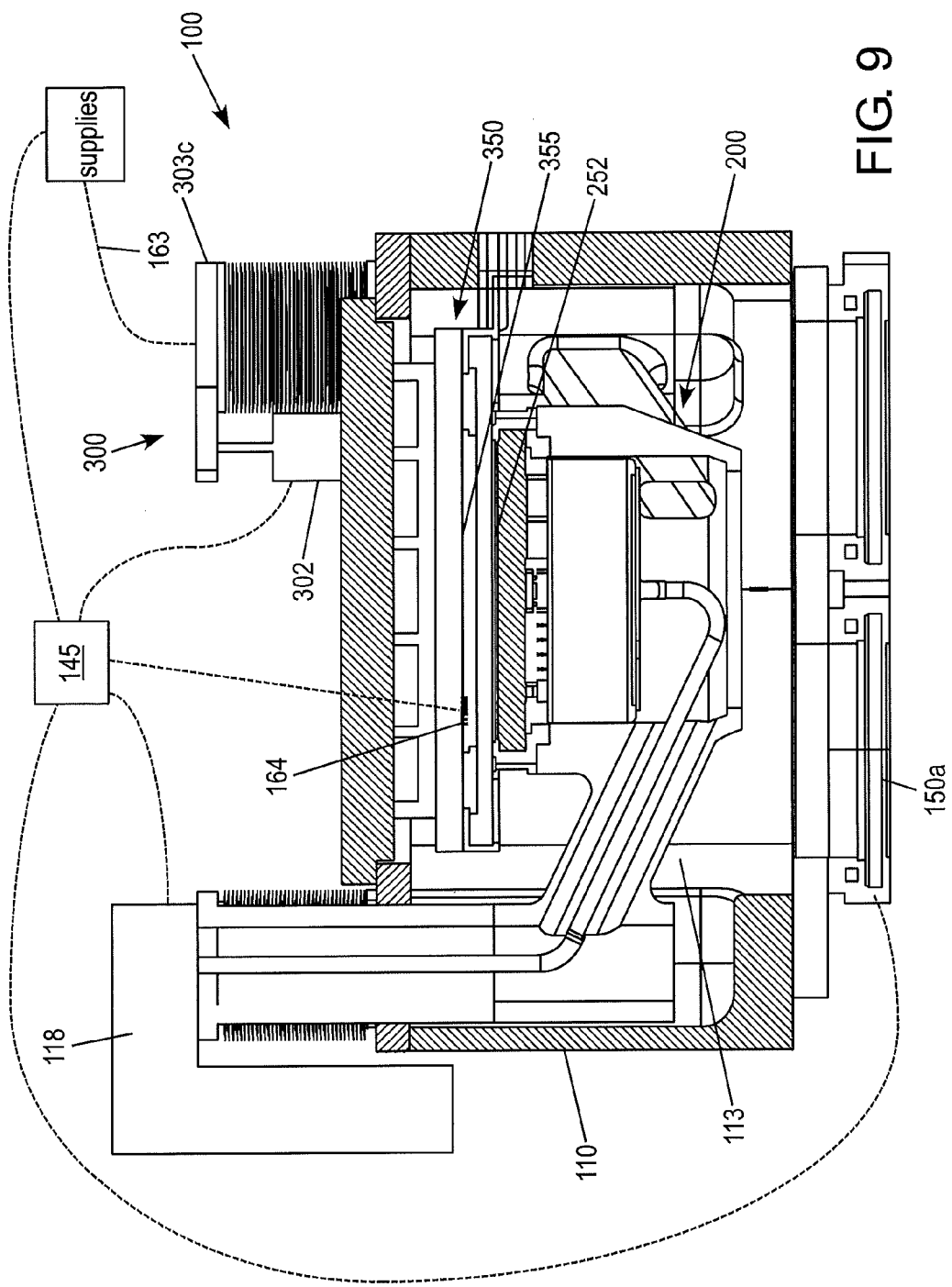

FIG. 9 illustrates a cross section of an embodiment of a capacitively-coupled plasma processing apparatus wherein the apparatus is electronically connected to a control system.

DETAILED DESCRIPTION

A substrate support and plasma processing chamber will now be described in detail with reference to a few embodiments thereof as illustrated in the accompanying drawings. In the following description, numerous specific details are set forth in order to provide a thorough understanding of the embodiments disclosed herein. It will be apparent, however, to one skilled in the art, that the embodiments disclosed herein may be practiced without some or all of these specific details. In other instances, well known process steps and/or structures have not been described in detail in order to not unnecessarily obscure the embodiments disclosed herein.

Disclosed herein is a substrate support and plasma processing chamber which improves plasma etch uniformity across a semiconductor substrate through mechanical adjustment of a semiconductor substrate support in an interior of a vacuum chamber of a plasma processing apparatus. The semiconductor substrate support is finely adjustable with respect to a gap height and a planarization between a top surface of the semiconductor substrate support and a bottom surface of an upper electrode assembly supported by the top wall of the vacuum chamber. The semiconductor substrate support allows in-situ adjustments of the semiconductor substrate with respect to gap height and planarization to optimize etch uniformity of the semiconductor substrate.

FIG. 1 is a cross-sectional schematic of an embodiment of a capacitively-coupled plasma processing apparatus 100 electronically connected to a control system 145, for a dry process reactor system, having an upper showerhead electrode assembly 350 for ion plasma density distribution control capability. A gas source 140 supplies a process gas through the upper showerhead electrode assembly 350 and is excited into a plasma via an RF power source 160 which provides RF power to the upper showerhead electrode assembly 350 to generate plasma in the gap between the upper showerhead electrode assembly 350 and a lower electrode assembly 250. The capacitively-coupled plasma processing apparatus 100 may be used in semiconductor fabrication for performing various semiconductor processes, such as dry etching, chemical vapor deposition (CVD), or other treatment of a semiconductor substrate 50.

Figure 2:
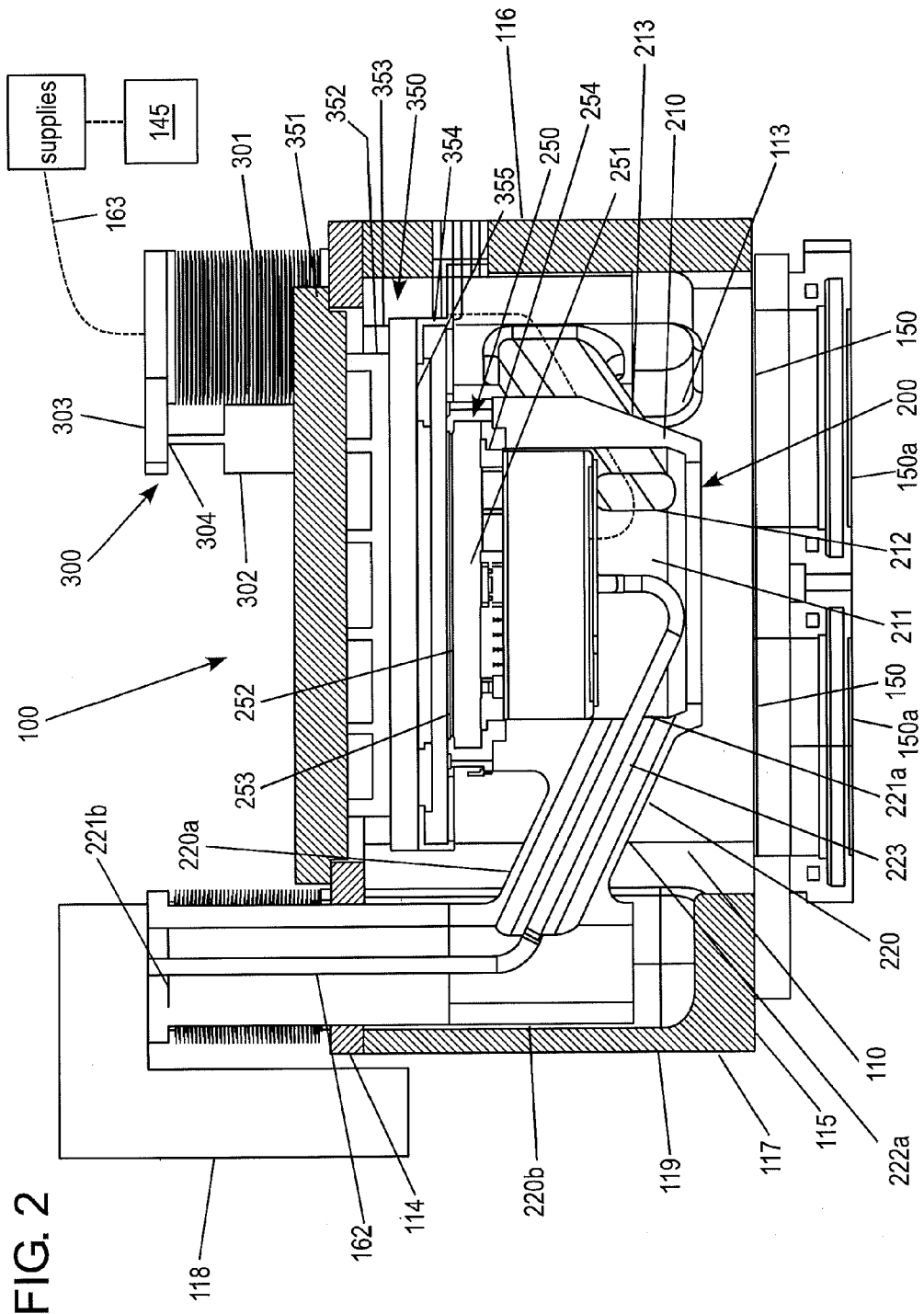
FIG. 2 illustrates a cross section through the capacitively-coupled plasma processing apparatus shown in FIG. 1.

FIG. 2 illustrates a cross section through the length of an embodiment of a capacitively-coupled plasma processing apparatus 100. The capacitively-coupled plasma processing apparatus 100 comprises a vacuum chamber 110, a semiconductor substrate support 200 including the lower electrode assembly 250 in an interior 113 of the vacuum chamber 110, the upper showerhead electrode assembly 350 supported by a top wall 114 of the vacuum chamber 110, dual vacuum pumps 150a operable to maintain the vacuum chamber 110 at a predetermined vacuum pressure, and a gas source (not shown) operable to supply process gases to the vacuum chamber 110. Process gases may be introduced into the vacuum chamber 110 via one or more source gas inlets and spent process gases and etchant by-products may be exhausted from the vacuum chamber 110 via dual vacuum ports 150. In some embodiments, the process gases may be introduced into the vacuum chamber 110 at a flow rate of about 5 to about 50,000 sccm (standard cubic centimeters per minute), and preferably at a flow rate of about 10 to about 5,000 sccm.

The semiconductor substrate support 200 is raised and lowered by three independent actuation mechanisms 300 such that a gap height and planarization between the semiconductor substrate support 200 and the upper showerhead electrode assembly 350 may be adjusted. The semiconductor substrate support 200 comprises a chuck body 210 including the lower electrode assembly 250, a plenum 211, and three radially extending bores 212 which extend between the plenum 211 and an outer periphery 213 of the chuck body 210. Three tubular support arms 220 each include a first section 220a extending radially outward from the outer periphery 213 of the chuck body 210, and a second section 220b extending vertically from the first section 220a. The second section 220b is configured to engage a respective actuation mechanism 300 located outside of the vacuum chamber 110 operable to effect vertical translation and planarization of the semiconductor substrate support 200.

Figure 6B:
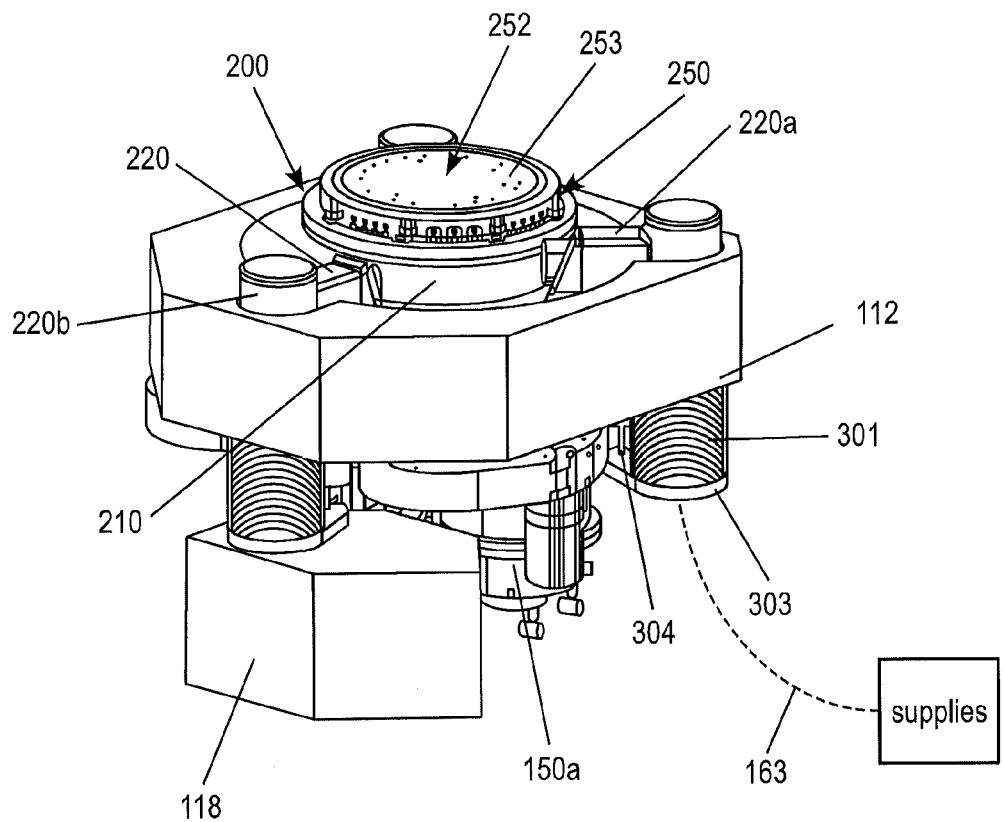

The first sections 220a of the tubular support arms 220 may extend outward either perpendicularly or at an angle to a vertical axis passing through the center of the chuck body 210. In one embodiment, the first sections 220a are angled upwardly from the chuck body 210. In another embodiment, the first sections 220a extend horizontally from the chuck body 210 at an angle perpendicular to a vertical axis passing through the center of the chuck body 210. (As illustrated in FIG. 6B)

The first and second sections 220a, 220b of the tubular support arms 220 can have any desired cross sectional shape such as a generally rectangular tube shape and/or a generally cylindrical tube shape. The tubular support arms 220 each comprise an inner passage 223, extending between first ends 221a and second ends 221b of the tubular support arms 220. The tubular support arms 220 have a first end 221a hermetically sealed to the chuck body 210 and a second end 221b coupled to a respective actuation mechanism 300 such that the respective radially extending bores 212 and the passages 223 of the tubular support arms 220 allow access from outside of the vacuum chamber 110 to the plenum 211 of the chuck body 210.

The tubular support arms 220 can be formed out of a single piece of material, or a plurality of separate parts mechanically attached or bonded (e.g., welded) together. The tubular support arms can be attached or bonded to the semiconductor substrate support 200 such that the tubular support arms are hermetically sealed to the chuck body 210.

The lower electrode assembly 250 of the chuck body 210 includes a lower electrode 251 and an electrostatic chuck (ESC) 252 for holding the semiconductor substrate 50 in place on a support surface 253 of the ESC 252. In other embodiments the chuck can be a vacuum or mechanical chuck. The vacuum chamber 110 has an opening 130 (as illustrated in FIG. 6A) in a side wall 119 such that the semiconductor substrate 50 may be transferred into the chamber and loaded/unloaded on and off the support surface 253 of the ESC 252. Additionally other suitable mechanisms, such as a lift pin mechanism for lifting the substrate, optical sensors, and a cooling mechanism for cooling the lower electrode assembly 250, are attached to or form portions of the lower electrode assembly 250. In a preferred embodiment the lower electrode assembly 250 further comprises a temperature controlled base plate 254.

Each tubular support arm 220 provides a passage 223 for receiving service conduits 163 which extend through the tubular support arm 220 into the chuck body 210 through the respective radially extending bore 212. The service conduits 163 are configured to supply at least one of a heat transfer gas, temperature controlled liquid coolant, RF energy, pressurized air, electrical monitoring signals, or electrical actuating signals to or from the chuck body 210. For instance, a service conduit could be used to supply pressurized gas to a pneumatic actuator of a lift pin mechanism in the lower electrode assembly 250. Other service conduits 163 can also be provided for various functions such as monitoring temperature of the substrate support 200 or pressure of the backside cooling gas, supplying nitrogen, helium, or clean dry air ("CDA") to keep moisture out of the service via, and/or supplying electrical power to components of the substrate support 200.

The service conduits 163 extend through the passages 223 of the tubular support arms 220 to the facility components located under the lower electrode assembly 250. Although the passages 223 are open to the atmosphere the summation of the atmospheric pressure in the plenum 211 does not yield any atmospheric load on the substrate support.

The tubular support arms 220 are preferably formed of a conducting material such as aluminum or anodized aluminum. Because outer peripheries 222a of the tubular support arms 220 are exposed to reactive process gases, the tubular support arms 220 can have an outer protective coating such as thermal sprayed yttria, or other material, compatible with the process gases.

A top or bottom wall 114, 115 of the vacuum chamber 110 can support an RF match 118. An RF transmission member 162 supplies the RF energy to the lower electrode assembly 250 during operation. The RF transmission member 162 preferably supplies RF energy through one tubular support arm 220 and respective radially extending bore 212 into the plenum 211 of the chuck body 210 wherein it is coupled to the lower electrode 251. The RF energy can have at least one frequency of, for example, about 2 MHz to about 100 MHz, e.g., 27 MHz and/or 60 MHz. Higher frequencies such as 13.56, 27, and/or 60 MHz can be used to excite the process gas to produce plasma in the gap between the upper and lower electrodes 353, 251, while another frequency, e.g. 2 MHz, of RF energy supplied to the lower electrode can provide RF bias to the substrate. The RF transmission member 162 is formed of a suitable conducting material. An RF connection (not shown) located near the first end 221a of the respective tubular support arm 220 collects the RF energy transmitted through the RF transmission member 162 and delivers the RF energy to the lower electrode assembly 250.

The level of RF matching between the RF supply and RF conductor depends on the dimensions of the RF transmission member 162. The lengths and diameters of the RF transmission member 162 extending through at least one tubular support arm 220 preferably have optimum values so that the RF power delivered through the RF transmission member 162 is optimized in a wide RF frequency range. In the illustrated embodiment, both the RF transmission member 162 and the RF match 118 are moved together during the gap adjustment. Thus, once the RF transmission member 162 is set to its optimum configuration, the configuration can be maintained without further adjustment when employing different gap heights during plasma processing.

In a preferred embodiment the RF transmission member 162 is isolated from the rest of the supplies being fed into the chuck body 210. The RF transmission member 162 will extend through one tubular support arm 220 into the chuck body 210, such as to electrically isolate the RF supply from the rest of the supplies, i.e. the heater power, ESC power, and gas supplies. Such electrical isolation will alleviate the need to filter residual RF from the RF transmission member 162 that could couple to the RF energy causing interference.

Figure 3:
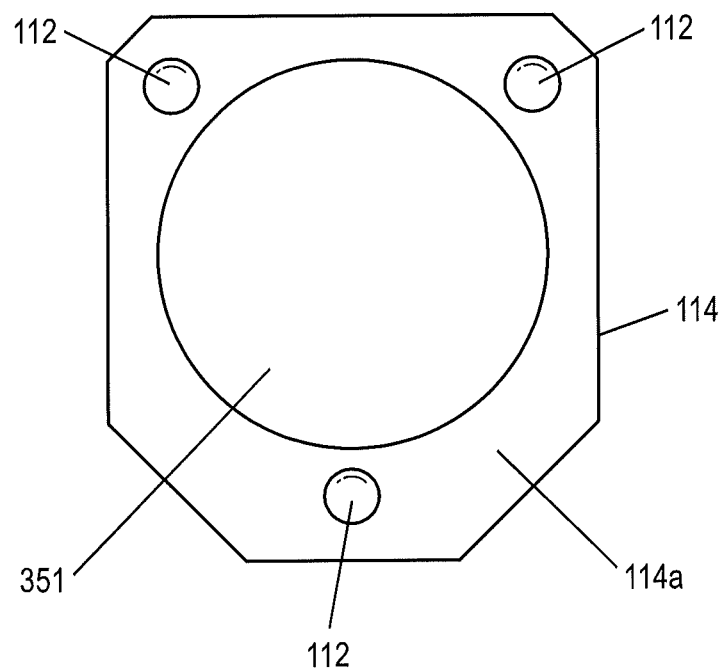
FIG. 3 illustrates a top view of the top wall of the capacitively-coupled plasma processing apparatus shown in FIG. 1.

FIG. 3 illustrates a top view of the top wall 114 of the capacitively-coupled plasma processing apparatus 100. The top wall 114 has three openings 112 circumferentially spaced on a top surface 114a of the top wall 114 of the vacuum chamber 110 wherein the second sections 220b of the tubular support arms 220 are movably located. In a preferred assembly the three openings 112 are spaced apart forming three angles therebetween, wherein two of the angles are between 120 and 165 degrees and the third angle is between 35 and 120 degrees.

FIG. 4A illustrates a preferred embodiment wherein the second sections 220b of the tubular support arms 220 are movably located in three respective openings 112 in the top wall 114 of the vacuum chamber 110. In one embodiment, the second ends 221b of the tubular support arms 220 are affixed to respective actuation mechanisms 300 located on the top surface 114a of the top wall 114 of the vacuum chamber 110 such that the actuation mechanisms 300 may perform a vertical translation of the semiconductor substrate support 200 by moving the support arms vertically through the openings 112 in the top wall 114. In an alternate embodiment, the second ends 221b of the tubular support arms 220 are affixed to respective actuation mechanisms 300 located on a bottom surface 115a of the bottom wall 115 of the vacuum chamber 110 such that the actuation mechanisms 300 may perform a vertical translation of the semiconductor substrate support by moving the support arms vertically through the openings 112 in the bottom wall 115. (See FIG. 6B).

The three actuation mechanisms 300 can each include a stepper motor 302 coupled to a flange 303 with the flange 303 supporting the respective second end 221b of each tubular support arm 220. In a preferred embodiment the actuation mechanisms 300 are coupled to the flanges 303 via a kinematic mounting arrangement 304.

"Kinematic mounting" means a technique of removably mounting a rigid object relative to another rigid object so as to yield a very accurate, reproducible positioning of the objects with respect to each other. The position of the first object is defined by six points of contact with the second. These six points must not over or under constrain the position of the first object. In one common form of kinematic mounting, three balls 315 on the first object contact features such as a conical depression 310, a V-shape (or groove) 311, and a flat contact 312, respectively, on the second object. The three balls 315 fit snugly within the three features 310, 311, 312 forming three angles therebetween, wherein two of the angles are between 120 and 165 degrees and the third angle is between 35 and 120 degrees. In a preferred embodiment the three angles formed therebetween have two angles between 120 and 140 degrees and the third angle between 80 and 120 degrees (see FIG. 8). The foregoing are only examples of mounting arrangements; numerous other kinematic mounting arrangements can also be used.

FIG. 4A illustrates a preferred embodiment of the kinematic mounting arrangement 304 supporting the semiconductor substrate support 200 comprising the features schematically illustrated in FIG. 8. The kinematic mounting arrangement 304 comprises three stepper motors 302 coupled to three tear drop flanges 303a,b,c. Each flange 303a,b,c comprises a feature wherein the first tear drop flange 303a comprises the conical depression 310, the second tear drop flange 303b comprises the V-shape 311, and the third tear drop flange 303c comprises the flat contact 312. Each stepper motor 302 drives a ball-tipped screw (not shown) wherein one screw supports each respective flange 303a,b,c and makes contact with each respective feature of each flange 303a,b,c. The flange 303a,b,c comprises an opening 305 for passage of service conduits 163 therethrough in conjunction with the passages 223 of the respective tubular support arms 220 and respective radially extending bores 212.

The stepper motors 302 are independently controlled by the control system 145 (see FIG. 1). The stepper motors 302 can be used to vary the tilt, pitch, and elevation of the semiconductor substrate support 200. The kinematic mounting assembly 304 which varies gap height and planarization through the independent control of the stepper motors increases stability as well as accommodates thermal expansion of the actuation mechanisms 300.

As illustrated in FIG. 4B the vacuum chamber 110 includes a cylindrical inner wall 116 with three vertical channels 117 extending into the inner wall 116. Each second section 220b of the tubular support arms 220 is located in and movable in the respective channels 117. The second sections 220b of the tubular support arms 220 are preferably centered in the vertical channels 117 by the kinematic alignment created by the six point kinematic mounting arrangement 304 such that rubbing does not occur between the surface of the vertical channels 117 and the outer peripheries 222a of the tubular support arms 220. Additionally, the vacuum chamber 110 comprises the opening 130 in a sidewall 119 wherein semiconductor substrates may be loaded/unloaded therethrough.

FIG. 4C illustrates dual vacuum ports 150 wherein vacuum pumps 150a can remove etch byproducts and maintain a low pressure in the interior 113 of the vacuum chamber 110.

As illustrated in FIG. 2 the upper showerhead electrode assembly 350 preferably comprises a showerhead electrode including an upper electrode 353 and an optional backing member (not shown) secured to the upper electrode 353, a thermal control plate 352, and a top plate. The top plate can form a removable top wall 114 of the vacuum chamber 110 of the capacitively-coupled plasma processing apparatus 100. In a preferred embodiment the upper showerhead electrode assembly 350 can also include a cooling plate 351 and a C-shaped confinement ring 354. Further details of the C-shaped confinement ring 354 can be found in commonly-owned U.S. Pat. No. 6,974,523, which is hereby incorporated by reference in its entirety.

The upper electrode 353 can be composed, for example, of silicon or silicon carbide. The upper electrode 353 is preferably a showerhead electrode including gas injection holes (not shown) for distributing gas in the vacuum chamber 110. The upper electrode 353 can be a one-piece electrode (e.g., a disc-shaped showerhead electrode with gas injection holes), or a multi-piece electrode (e.g., an inner disc-shaped showerhead electrode surrounded by an outer electrode ring, such as a continuous or segmented ring without gas injection holes).

In a multi-piece arrangement the inner electrode member is preferably a cylindrical plate (e.g., single crystal silicon). The inner electrode member can have a diameter smaller than, equal to, or larger than the 450 mm semiconductor substrate 50 to be processed. In alternate embodiments, the upper showerhead electrode assembly 350 and the semiconductor substrate support 200 including the chuck body 210 can be removably mounted within the vacuum chamber 110.

The upper showerhead electrode assembly 350 preferably comprises a C-shaped confinement ring 354 for confining the plasma to the space surrounded by the upper and lower electrode assemblies 350, 250 while allowing neutral gas constituents in the gap to pass through the gaps in a generally horizontal direction. Then, neutral gas constituents flow into the space between the inner cylindrical wall 116 of the vacuum chamber 110 and the outer surface of the C-shaped confinement ring 354. The C-shaped confinement ring 354 encloses substantially all of an inter-electrode volume between the upper showerhead electrode assembly 350 and lower electrode assembly 250. The C-shaped confinement ring 354 can include a plurality of openings, each opening extending substantially a length of an inter-electrode gap between the planar surfaces of the first and the second electrodes and facilitating gas flow from the gap between the upper and lower electrode assemblies 350, 250 to the vacuum pump 150.

The pressure in the interelectrode gap is controlled by the vacuum pump assembly attached to the bottom surface 115a of the bottom wall 115 of the vacuum chamber 110. As such, the C-shaped confinement ring 354 separates the gap for plasma excitation from the remaining interior 113 of the vacuum chamber 110. In general, the volume of the gap is small compared to that of the vacuum chamber 110. Because the etch rate of the semiconductor substrate 50 is directly affected by the plasma in the gap, the C-shaped confinement ring 354 enables a small volume pressure control and plasma confinement over the entire range of the gap without major physical change to the vacuum chamber 110. Also, as the volume of the gap is small, the plasma conditions can be controlled quickly and accurately.

In a preferred embodiment of the capacitively-coupled plasma processing apparatus 100, the three actuation mechanisms 300 are independently controllable with respect to each other. Independent control of each actuation mechanism 300 allows for vertical translation of the semiconductor substrate support 200 as well as planarization between the support surface 253 of the ESC 252 and the bottom surface 355 of the upper showerhead electrode assembly 350. Control of the gap level and the planarization of the support surface 253 of the ESC 252 can provide more uniform etch results in plasma processing apparatus 100.

In the embodiment illustrated in FIG. 4A-C, the three actuation mechanisms 300 are located on the top surface 114a of the top wall 114 of the vacuum chamber 110. The second sections 220b of the tubular support arms 220 are each located in a respective opening 112 in the top wall 114 of the vacuum chamber 110. Each second end 221b of the tubular support arms 220 is coupled to the respective actuation mechanism 300, and maintains an airtight expandable vacuum seal 301 between an outer periphery 222a of the tubular support arm 220 and the top surface 114a of the top wall 114 of the vacuum chamber 110. Each airtight vacuum seal 301 is expandable such that each tubular support arm 220 may be vertically translated by the respective actuation mechanism 300 while maintaining a desired vacuum pressure in the vacuum chamber 110. The RF match 118 is coupled to one actuation mechanism 300 suspended above the top wall 114 such that the RF match 118 will travel with the support arm during vertical translation of the semiconductor substrate support 200.

FIG. 5 shows a cross section through the length of an alternate embodiment of the capacitively-coupled plasma processing apparatus 100 wherein the three actuation mechanisms 300 are located on the bottom surface 115a of the bottom wall 115 of the vacuum chamber 110. The second sections 220b of the tubular support arms 220 are each located in a respective opening 112 in the bottom wall 115 of the vacuum chamber 110. Each second end 221b of the tubular support arms 220 is coupled to the respective actuation mechanism 300, and maintains an airtight expandable vacuum seal 301 between an outer periphery 222a of the tubular support arm 220 and the bottom surface 115a of the bottom wall 115 of the vacuum chamber 110. Each airtight vacuum seal 301 is expandable such that each tubular support arm 220 may be vertically translated by the respective actuation mechanism 300 while maintaining a desired vacuum pressure in the vacuum chamber 110. The RF match 118 is coupled to one actuation mechanism 300 suspended below the bottom wall 115 such that the RF match 118 travels with the support arm during vertical translation of the semiconductor substrate support 200.

As illustrated in FIG. 9 the capacitively-coupled plasma operating apparatus 100 is electronically connected to the control system 145. The control system 145 is electronically connected to the RF power supply and the RF match network 118, the three actuation mechanisms 300, a semiconductor handling system (not shown) for loading and unloading semiconductor substrates, the gas supply, the vacuum pump 150, and the cooling system. The control system 145 controls and coordinates the operation of the above-mentioned systems through respective electronic signals. The actuation mechanisms 300 are each independently controlled by the control system 145. In a preferred embodiment, the control system 145 vertically positions the semiconductor substrate support 200 within the interior 113 of the vacuum chamber 110 via the transmission of electronic signals to the respective stepper motors 302 comprised in the actuation mechanisms 300. The kinematic mounting arrangement 304 comprised between the stepper motors 302 and flanges 303a,b,c is configured to effectuate a degree of precision in adjusting the gap, preferably to few tenths of microns and in adjusting the planarization, preferably to less than a thousandth of a degree. In alternate embodiments, other drive mechanisms can be used such as a servo motor arrangement.

Additionally, the control system 145 is preferably electronically connected to at least one in-situ sensor for measuring the gap height and planarity such that the gap control and planarization control are performed in a feedback control mode. Various types of in-situ detectors, such as laser, inductive, capacitive, acoustic, linear variable differential transformer (LDVT) sensors, can be used as a gap and planarity sensor and located either inside or outside the vacuum chamber 110, depending on the type of sensor. In a preferred embodiment a laser interferometer 164 is coupled to the bottom surface 355 of the upper showerhead electrode assembly 350. The at least one laser interferometer 164 provides signals to the control system 145 to effect real time measurements of the gap height and the planarization between the support surface 253 of the ESC 252 and the upper showerhead electrode assembly 350.

As illustrated in FIG. 7 the vacuum chamber 110 is coupled to a vacuum pump system located in the bottom wall 115 of the vacuum chamber 110 via dual vacuum ports 150 in the bottom wall 115. The vacuum pump system includes dual vacuum pumps 150a, such as a turbo-molecular pump of the kind typically used in plasma reactor systems, a respective gate valve (not shown) arranged between the semiconductor substrate support 200 and the vacuum pump 150a for controlling the vacuum level in the interior 113 of the vacuum chamber 110. The vacuum pump system can include a roughing pump (not shown) connected to the vacuum pump 150a and the vacuum chamber 110 for initially pumping down the vacuum chamber interior region 113. The gate valve can be electromechanical so that it can be remotely operated via an electrical signal from the control system 145. The vacuum pump system and the process gas together are capable of reducing the pressure in chamber to between approximately 1 mTorr and approximately 1 Torr, depending on the application. The location of the vacuum pump system directly underneath chuck body 210 in the present embodiment is made possible by tubular support arms 220, and preferably serves to make the flow of gas axially symmetric.

Embodiments disclosed herein enable precise lower electrode orientation with regard to gap height and planarization for processing 450 mm wafers. The adjustment of lower electrode gap height and planarization may take place while a plasma processing system is under vacuum, atmosphere, and/or in-situ, since the user interfaces are disposed outside the plasma processing chamber. Embodiments disclosed herein may also allow the adjustment to be made with no disassembly of the plasma processing system. Advantageously, system down time may be minimized, and productivity need not be compromised, while the needs for electrode gap height and planarization adjustments are satisfied.

While the invention has been described in detail with reference to specific embodiments thereof, it will be apparent to those skilled in the art that various changes and modifications can be made, and equivalents employed, without departing from the scope of the appended claims.

What is claimed is:

1. A semiconductor substrate support for use in a plasma processing apparatus comprising:
a chuck body having a plenum and three radially extending bores extending between the plenum and an outer periphery of the chuck body, the chuck body sized to support a semiconductor substrate having a diameter of at least 450 mm; and
three tubular support arms attached to the chuck body, each of the tubular support arms including a first section extending radially outward from the outer periphery of the chuck body and a second section extending vertically from the first section, each of the tubular support arms defining a passage in communication with one of the bores, each of the second sections configured to engage with a respective actuation mechanism operable to effect vertical translation for gap height and planarization adjustment of the chuck body.

2. The semiconductor substrate support of claim 1, wherein the first sections of the tubular support arms extend outward either perpendicularly or at an angle to a vertical axis passing through the center of the chuck body.

3. The semiconductor substrate support of claim 1, wherein the second sections of the tubular support arms extend from the respective first sections of the tubular support arms vertically above the chuck body or extend from the respective first sections of the tubular support arms vertically below the chuck body.

4. The semiconductor substrate support of claim 1, wherein the tubular support arms are circumferentially spaced apart forming three angles therebetween, two of the angles being between 120 and 165 degrees and the third angle being between 35 and 120 degrees.

5. A capacitively-coupled plasma processing apparatus comprising:
a vacuum chamber;
the semiconductor substrate support of claim 1 in an interior of the vacuum chamber;
an upper showerhead electrode assembly supported by a top wall of the vacuum chamber;
a lower electrode assembly incorporated in the semiconductor substrate support wherein the lower electrode assembly comprises a lower electrode and an electrostatic chuck (ESC) having a support surface on which the semiconductor substrate is supported;
three openings in an outer wall of the vacuum chamber in which the second sections of the tubular support arms are located;
three actuation mechanisms on the outer wall and connected to the second sections of the tubular support arms, the three actuation mechanisms operable to independently move the tubular support arms in upward and downward directions;
at least one vacuum port in a bottom wall connected to at least one vacuum pump operable to maintain the vacuum chamber at a predetermined vacuum pressure; and
a gas source operable to supply process gas through the upper showerhead electrode assembly to the vacuum chamber.

6. The capacitively-coupled plasma processing apparatus of claim 5, wherein an expandable vacuum seal seals each opening in the outer wall and maintains a vacuum tight seal between an outer periphery of each tubular support arm and the outer wall such that each tubular support arm may be vertically translated by the respective actuation mechanism without exposing the interior of the vacuum chamber to atmospheric pressure.

7. The capacitively-coupled plasma processing apparatus of claim 5, wherein the three actuation mechanisms are independently controllable with respect to each other to effect a predetermined gap height between the upper showerhead electrode assembly and the support surface of the ESC and a predetermined planarization of the support surface of the ESC.

8. The capacitively-coupled plasma processing apparatus of claim 7, wherein each actuation mechanism comprises a stepper motor coupled to a mount on the outer wall of the vacuum chamber, the mount affixed to the respective tubular support arm such that the tubular support arm is movably located in the respective opening in the outer wall of the vacuum chamber.

9. The capacitively-coupled plasma processing apparatus of claim 6, wherein the three actuation mechanisms are located on a top surface of the top wall of the vacuum chamber.

10. The capacitively-coupled plasma processing apparatus of claim 6, wherein the three actuation mechanisms are located on a bottom surface of the bottom wall of the vacuum chamber.

11. The capacitively-coupled plasma processing apparatus of claim 5, wherein the vacuum chamber includes two vacuum ports in the bottom wall of the chamber, the bottom wall being separated from the semiconductor substrate support by an open area, the vacuum ports being connected to two vacuum pumps which remove gases from the interior of the vacuum chamber and maintain the interior of the vacuum chamber at a pressure below 500 mTorr.

12. The capacitively-coupled plasma processing apparatus of claim 5, wherein the semiconductor substrate support includes a plurality of service conduits extending through one or more of the passages of the tubular support arms into the chuck body through the radially extending bores, the service conduits supplying at least one of a heat transfer gas, temperature controlled liquid coolant, RF energy, pressurized air, electrical monitoring signals or electrical actuating signals to or from the chuck body.

13. The capacitively-coupled plasma processing apparatus of claim 5, wherein the lower electrode is coupled to a radio frequency (RF) power supply via an RF transmission member extending through one of the tubular support arms.

14. The capacitively-coupled plasma processing apparatus of claim 13, wherein only the RF transmission member is located in one of the tubular support arms, and service conduits for supplying at least one of a heat transfer gas, temperature controlled liquid, pressurized air, electrical monitoring signals, or electrical actuating signals to or from the chuck body are located in one or more of the other tubular support arms.

15. The capacitively-coupled plasma processing apparatus of claim 5, wherein the showerhead electrode assembly includes a C-shaped confinement ring positioned about the periphery of the upper showerhead electrode assembly and the lower electrode assembly within the vacuum chamber, the C-shaped confinement ring enclosing substantially all of an inter-electrode volume between the upper showerhead electrode assembly and lower electrode assembly and comprising a plurality of openings, each of the openings extending substantially a length of an inter-electrode gap between the planar surfaces of the upper showerhead electrode and the support surface of the ESC and facilitating gas exhaustion from the inter-electrode volume to the remaining volume of the vacuum chamber.

16. The capacitively-coupled plasma processing apparatus of claim 5, wherein the lower electrode assembly further comprises a temperature controlled base plate.

17. The capacitively-coupled plasma processing apparatus of claim 5, wherein the vacuum chamber includes a cylindrical inner wall with three vertical channels extending into the inner wall, the tubular support arms located in and movable vertically in the channels.

18. A capacitively-coupled plasma processing apparatus according to claim 5, further including a control system in electrical communication with said actuation mechanisms for controlling gap height and planarization.

19. The capacitively-coupled plasma processing apparatus of claim 18, further comprising at least one laser interferometer, the laser interferometer providing signals to the control system to effect real time measurements of the gap height and the planarization between the upper showerhead electrode assembly and the support surface of the ESC.

20. The capacitively-coupled plasma processing apparatus of claim 19, wherein the control system controls the actuation mechanisms to adjust in situ, gap height and planarization between the upper showerhead electrode assembly and the support surface of the ESC to effectuate uniform etching of the semiconductor substrate based on the measurements taken by the at least one laser interferometers.

21. A method of etching a semiconductor substrate in a plasma processing apparatus according to claim 5 comprising:
placing a semiconductor substrate on the support surface of the ESC inside the vacuum chamber;
vertically translating the semiconductor substrate support to achieve a predetermined gap height between the semiconductor substrate and a bottom surface of the upper showerhead electrode assembly;
measuring planarization between the semiconductor substrate and the bottom surface of the upper showerhead electrode assembly to determine if desired planarization between said substrate and upper showerhead electrode exists;
adjusting in-situ the planarization of the semiconductor substrate relative to the bottom surface of the upper showerhead electrode assembly;
supplying a gas into the vacuum chamber from a gas supply; and
energizing the gas into a plasma state and etching the semiconductor substrate with the plasma.

22. The method of claim 21, wherein the in-situ planarization of the semiconductor substrate is adjusted during the plasma etching.

* * * * *